United States Patent [19]
Gleim et al.

[11] Patent Number: 5,784,127
[45] Date of Patent: Jul. 21, 1998

[54] CIRCUIT FOR THE POWER SUPPLY OF A PLURALITY OF POWER AMPLIFIERS

[75] Inventors: Günter Gleim, Villingen-Schwenningen; Jacques Chauvin, Mönchweiler; Jean-Paul Louvel, Villingen-Schwenningen, all of Germany

[73] Assignee: Deutsche Thomson Brandt GmbH, Villingen-Schwenningen, Germany

[21] Appl. No.: 686,754

[22] Filed: Jul. 25, 1996

[30] Foreign Application Priority Data

Sep. 27, 1995 [DE] Germany ............... 195 35 868.6

[51] Int. Cl.[6] ........................................... H04N 5/63
[52] U.S. Cl. ................... 348/730; 330/295; 330/297
[58] Field of Search ........................ 348/730; 330/295, 330/297, 123, 128, 202; H04N 5/63

[56] References Cited

U.S. PATENT DOCUMENTS 4,616,302  10/1986  Mandelcorn .................. 363/50

FOREIGN PATENT DOCUMENTS

| 3111776 | 3/1981 | Germany | H03F 3/68 |
| 4228833 | 8/1992 | Germany | H03F 3/68 |
| 4231925 | 9/1992 | Germany | H03G 3/20 |

OTHER PUBLICATIONS

Patent Abstracts of Japan, 60–260216 A., E–403 May 14, 1986.
Patent Abstracts of Japan, 2–52512 A., E–925 May 9, 1990, vol. 14, No. 218.
Copy of Search Report.

*Primary Examiner*—Glenton B. Burgess
*Attorney, Agent, or Firm*—Joseph S. Tripoli; Frederick A. Wein

[57] ABSTRACT

When a power supply unit supplies power to a plurality of power amplifiers, an appreciable power loss is produced in the power supply unit and in the amplifiers. According to the present invention, the output voltage of the power supply unit is regulated so that it is high enough at any instant for the amplifier which at that instant has an output signal having the largest amplitude.

7 Claims, 1 Drawing Sheet

CIRCUIT FOR THE POWER SUPPLY OF A PLURALITY OF POWER AMPLIFIERS

BACKGROUND

The invention is based on a circuit for the power supply of a plurality of power amplifiers. A circuit of this type is used, for example, in a projection television system to supply operating voltage to six amplifiers for driving the correction coils for the convergence of the colours red, green and blue, in each case in the horizontal and vertical direction. The circuit can also be used to supply operating voltage to a plurality of AF audio amplifiers in an audio system.

A circuit of this type for feeding a plurality of power amplifiers generally requires a considerable outlay, particularly when a high frequency response is required, as in the case of convergence, and the power supply unit has to be designed for the situation where all of the amplifiers are simultaneously driven at the maximum level. Since the operating voltages generated by the power supply unit are generally stabilized, considerable power losses occur in the power supply unit and in the amplifiers.

SUMMARY OF THE INVENTION

The invention is based on the object, in the context of a circuit of this type, of reducing the circuitry for the power supply unit and the power loss in the power supply unit and in the amplifiers.

The invention thus consists in the fact that the output voltage of the power supply unit is regulated in such a way that at any instant it is high enough for the amplifier which at this instant has the output signal having the largest amplitude.

The invention is based on the following considerations and insights. In the case of a power supply circuit for a plurality of amplifiers of the type described, the respective drive level of the amplifiers due to the signals, for example for convergence in a projection television system, varies greatly and can fluctuate virtually from zero up to the maximum drive level in each amplifier. It is therefore advantageous first of all to ascertain at which of the amplifiers the output signal has the maximum amplitude at each instant. The output voltage of the power supply unit, which passes as the operating voltage in parallel to all of the amplifiers, is then regulated as a function of this amplitude in such a way that it is sufficient for this very amplifier. The operating voltage supplied by the power supply unit is therefore matched at every instant to the actual amplitude of the output signal at the output of the amplifier driven at the maximum level. All of the other amplifiers, too, then necessarily receive a sufficient operating voltage, because the amplitude of the signal is smaller at these amplifiers. This matching of the operating voltage generated by the power supply unit to the actual drive level of the amplifier having the maximum output amplitude reduces the power loss both in the power supply unit and in the amplifiers.

The output signals of all of the amplifiers are preferably applied to a circuit which responds only to the output signal having the largest amplitude. A regulating voltage is derived from this output signal and fed to a regulating input of the power supply unit.

The outputs of the amplifiers are connected to a first common circuit point via first diodes connected in the same polarity, which first common circuit point is connected to the regulating input of the power supply unit. In order to evaluate the positive and negative half-cycles of the output voltages of the amplifiers, in this case the outputs of the amplifiers are preferably additionally connected to a second circuit point via second diodes connected in the opposite polarity to the first diodes, which second circuit point is connected to the first circuit point via an invertor.

The power supply unit preferably supplies a positive operating voltage and an identical, negative operating voltage for the individual amplifiers operating in a push-pull manner. These operating voltages preferably have the same magnitude and are always regulated to the same values as a function of the amplitude of the signal.

According to a development of the invention, the two operating voltages of opposite polarity are generated in two separate power supply units and are regulated independently of one another, that is to say no longer have the same amplitude. Preferably, the positive operating voltage is regulated as a function of the positive half-cycles of the signal and the negative operating voltage is regulated as a function of the negative half-cycles of the signal.

BRIEF DESCRIPTION OF THE DRAWING(S)

The invention is explained below with reference to the drawing, in which

FIG. 1 shows an exemplary embodiment of the circuit according to the invention, and FIG. 2 shows, in principle, the dependence of the operating voltages generated by the power supply unit on the respective amplitude of the signal at the output of an amplifier.

DESCRIPTION OF THE PREFERRED EMBODIMENT(S)

Figure 1:
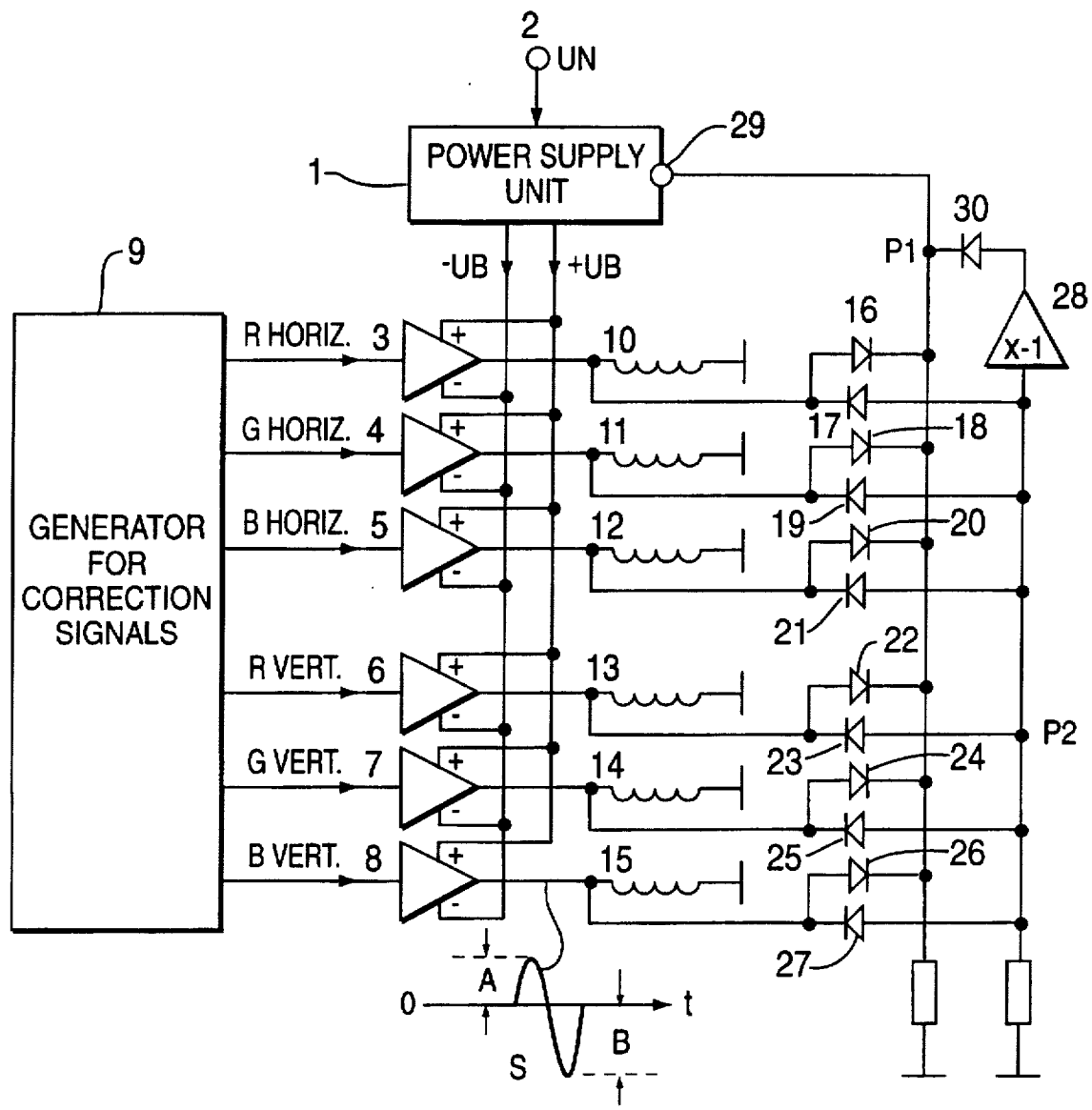

In FIG. 1, the power supply unit 1 is connected to a terminal carrying the power supply voltage UN. The power supply unit 1 generates two identical operating voltages +UB and −UB of opposite polarity. These operating voltages +UB and −UB are applied in parallel to the operating voltage inputs of six amplifiers 3–8, the outputs of which are connected to correction coils 10–15. The correction coils 10–15 are used for convergence correction for the colours red, green and blue, both in the horizontal and in the vertical direction in a projection tele-vision system. For this purpose, the amplifiers 3–8 are fed with corresponding correction signals from the generator 9. The circuit described this far is known.

The outputs of the amplifiers 3–8 are connected to the circuit point P1 via diodes 16, 18, 20, 22, 24, 26, which circuit point P1 is connected to the regulating input 29 of the power supply unit 1. The outputs of the amplifiers 3–8 are additionally connected to the circuit point P2 via diodes 17, 19, 21, 23, 25, 27 connected in the opposite polarity, which circuit point P2 is connected to the circuit point P1 via the invertor 28 and the diode 30.

The method of operation is explained with reference to FIG. 2. It is assumed that the signal S of the amplifier 8 has the maximum amplitude, in other words the output voltages of the amplifiers 3–7 have a smaller amplitude. The diode 26 is switched on by the positive half-cycle having the amplitude A, with the result that this half-cycle passes to the circuit point P1. As a result, the diodes 16, 18, 20, 22, 24 are necessarily switched off, because the amplitudes of the output voltages of the amplifiers 3–7 are smaller. As a result of the negative half-cycle having the amplitude B, the diode 27 is switched on and, correspondingly, the diodes 17, 19, 21, 23, 25 are switched off. The half-cycle having the amplitude B is inverted in the invertor 28 and is added with the same polarity of the half-cycle having the amplitude A at the circuit point P1. The input signal at the regulating input 29 is therefore a measure of the amplitude of the output signal of the amplifier 8. As a function of this amplitude, the operating voltages +UB and −UB are now regulated to a value which is such that it is sufficient precisely for the amplitude of the signal S at the amplifier 8. As a result, the operating voltages +UB and −UB are also large enough for the amplifiers 3–7, since the signal has a smaller amplitude at these amplifiers than at the amplifier 8.

Figure 2:
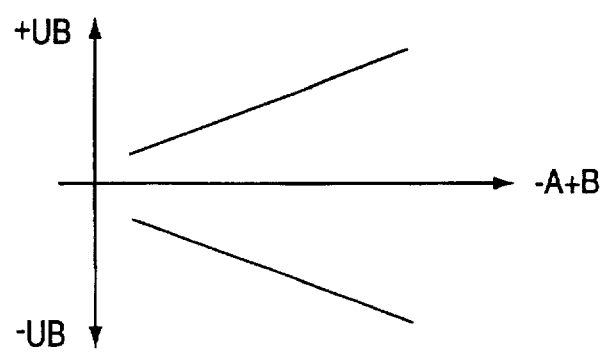

According to FIG. 2, the amplitude of the operating voltages +UB and −UB is a continuously analogous function of the amplitude A+B. The amplitude of the operating voltages +UB and −UB may also be a stepwise function of the amplitude of the signal S. For example, a plurality of different operating voltages of varying amplitude can be connected to the amplifiers 3–8 depending on the amplitude of the signal S.

Up until now, it has been assumed that the two operating voltages +UB and −UB according to FIG. 2 have the same amplitude for all values of the signal A+B. It is also possible to generate the two operating voltages +UB and −UB in separate power supply units and to regulate the level of the operating voltage +UB as a function of the positive amplitude A of the signal S and the negative operating voltage −UB as a function of the amplitude B of the negative half-cycle of the signal S. Even better matching of the operating voltage to the actual amplitudes of the signal and a further saving of power can be achieved thereby.

We claim:

1. A power supply circuit comprising:

a power supply having a common output coupled to power supply input connections of a plurality of amplifiers, output signals of said respective amplifiers being coupled to a circuit which responds to the output signal having a largest amplitude, a regulating voltage derived from said circuit is applied to a regulating input of the power supply, and an output voltage of the power supply being regulated responsive to the regulating voltage so that at any instant said output voltage is high enough for the one of said amplifiers which at that instant has the output signal having the largest amplitude.

2. The power supply circuit according to claim 1, wherein the outputs of the amplifiers are coupled to a first common circuit point via first diodes coupled in the same polarity, which first common circuit point is coupled to the regulating input of the power supply.

3. The power supply circuit according to claim 2, wherein the outputs of the amplifiers are coupled to a second circuit point via second diodes coupled in the opposite polarity to the first diode, which second circuit point is coupled to the first circuit point via an inverter.

4. The power supply circuit according to claim 1, wherein the power supply supplies a positive operating voltage and a negative operating voltage for each of said amplifiers.

5. The power supply circuit according to claim 4, wherein amplitudes of the positive operating voltage and of the negative operating voltage are regulated independently of one another.

6. The power supply circuit according to claim 5, wherein the positive operating voltage is regulated as a function of the amplitude of the positive half-cycle of the signal and the negative operating voltage is regulated as a function of the amplitude of the negative half-cycle of the signal.

7. The power supply circuit according to claim 1, wherein said amplifiers are six output amplifiers feeding respective correction coils for horizontal and vertical convergence for red, green and blue.

* * * * *